United States Patent [19]

Ueno et al.

[11] Patent Number: 5,334,829
[45] Date of Patent: Aug. 2, 1994

[54] PACKAGE FOR SOLID STATE IMAGER WITH HEATING MEANS TO REPAIR IMAGER LATTICE DEFECT

[75] Inventors: Takahisa Ueno; Hideshi Abe, both of Kanagawa, Japan

[73] Assignee: Sony Corporation, Japan

[21] Appl. No.: 5,796

[22] Filed: Jan. 19, 1993

[30] Foreign Application Priority Data

Jan. 27, 1992 [JP] Japan .................................. 4-012284

[51] Int. Cl.$^5$ .............................................. H01J 40/14
[52] U.S. Cl. .................................. 250/208.1; 250/238
[58] Field of Search ................. 250/216, 208.1, 208.2, 250/238

[56] References Cited

U.S. PATENT DOCUMENTS 5,235,184 8/1993 Paulson ................................. 250/238

Primary Examiner—David C. Nelms
Attorney, Agent, or Firm—Ronald P. Kananen

[57] ABSTRACT

A CCD image sensor includes a package (2) in which there are packaged a CCD solid state imaging device (1) in which a getter layer is formed on the rear surface of a silicon substrate and a photo-sensing portion and a CCD register are formed on the surface of the silicon substrate and a substrate electrode (3) of a plate configuration disposed on the lower surface of the CCD solid state imaging device (1). A heating device (5) is disposed on the lower surface of the substrate electrode (3) through an insulating material (4) of a plate configuration. The heating device (5) is formed of a resistance pattern (7) that is formed on the surface of an insulating body (6) of a plate configuration by a well-known thick film forming technique. A lattice defect that is caused by a metal ion or the like entered into the CCD solid state imaging device in accordance with an aging change can be repaired without disassembling the solid state image sensor. Thus, the occurrence of a fixed pattern noise on a reproduced picture can be reduced readily.

12 Claims, 4 Drawing Sheets

PACKAGE FOR SOLID STATE IMAGER WITH HEATING MEANS TO REPAIR IMAGER LATTICE DEFECT

BACKGROUND OF THE INVENTION

Field of the Invention

The present invention relates generally to a solid state imager including a CCD (charge-coupled device) solid state imaging device and a package for packaging the CCD solid state imaging device and, more particularly, is directed to a solid state imager which can reduce a so-called fixed pattern noise that is caused in the solid state imaging device due to an aging change.

Description of the Related Art

In general, a solid state imager, e.g., a CCD image sensor includes a CCD solid state imaging device in which an MOS (metal oxide semiconductor) capacitor of a CCD transfer stage or a pn-junction photodiode is used to effect a photoelectric conversion and a CCD shift register is used to effect the vertical scanning and the horizontal scanning.

A capacity of the CCD register in the CCD solid state imaging device is small and all signal charges can be detected by a single output diode having a small capacity. Therefore, an output-voltage thereof becomes sufficiently large and a random noise is reduced. There is then the advantage that the CCD solid state imaging device is excellent in signal-to-noise (S/N) ratio and high in sensitivity.

In the process stage for fabricating the CCD solid state imaging device, a silicon substrate which serves as a base of the solid state imaging device is put into various treatment apparatus (epitaxial growth apparatus, and so forth). These treatment apparatus have metal exposed portions and the treatment is carried out at high temperature. As a result, a metal ion caused by the metal exposed portion within the apparatus is absorbed in the silicon substrate. There is then the disadvantage such that the metal ion causes a crystal defect (lattice defect) to occur within the silicon substrate. Further, if radiant rays such as $\alpha$ rays or the like become incident on a semiconductor substrate, then a lattice defect occurs within the semiconductor substrate. The lattice defect, caused by radiant rays, becomes a permanent damage unlike an instantaneous noise such as a soft error known in a semiconductor memory or the like.

These lattice defects cause a dark current to occur. In the solid state imaging device, if a storage electric charge—output signal voltage conversion efficiency $\eta$ is taken as $\eta = 10 \ \mu V/e$, then in the case of field storage, produced electric charges of about $10^2 e$ are confirmed on an image. On the other hand, electric charges of $10^6 e$ or more are required to cause the memory to malfunction. As described above, the solid state imaging device is very sensitive to the dark current. As the dark current is increased, a white noise component also is increased. There is then the problem that a so-called fixed pattern noise takes place on a reproduced picture. In addition, if the lattice defect occurs, then a lifetime of the device is lowered and a leakage current is increased.

To solve the aforesaid problem of the metal ion, there is proposed such a system that a polycrystalline silicon layer is formed on the rear surface of the silicon substrate and this polycrystalline silicon layer is used as a getter layer for gettering a metal ion. More specifically, a grain boundary in the polycrystalline silicon layer is utilized as a lattice defect absorbing source and a metal existing in the inside of the silicon substrate and the lattice defect caused thereby are gettered on the rear surface of the silicon substrate.

According to this proposed system, the lattice defect that occurs due to the metal ion produced from the treatment apparatus or the like in the CCD process can be avoided, which can lead to the reduction of the dark current.

Further, in the CCD solid state imaging device, a micro-lens, a color filter, and so forth, are formed on a photo-sensing section (e.g., a pn-photodiode). In that case, the following phenomenon has been known. That is, a metal ion is progressively flowed from the micro-lens or color filter with the lapse of time. In particular, after the CCD solid state imagers were commercially supplied to the market as products, the metal ion thus flowed enters the silicon substrate to cause the lattice defect to occur again, which as a result leads to an increase of dark current.

The increase of dark current is displayed on the reproduced picture as the fixed pattern noise as described above so that, when the fixed pattern noise is displayed on the reproduced picture, the CCD solid state imager is disassembled in the factory and the CCD solid state imaging device is taken out from the CCD solid state imager thus disassembled. Then, the CCD solid state imaging device heated at a constant temperature for a long period of time to thereby remove the above-mentioned fixed pattern noise.

According to the above-mentioned method, the CCD solid state imaging device, in particular, the silicon substrate that serves as the base is heated at a constant temperature so that the metal ion that entered the silicon substrate is set in such a state as to be moved easily. Consequently, the metal ion and the lattice defect caused thereby are absorbed by the polycrystalline silicon layer formed on the rear surface of the silicon substrate.

According to this previously-proposed method, however, CCD solid state imager devices must be disassembled one by one. This previously-proposed method is therefore disadvantageous from a labor standpoint and also from a standpoint such that the CCD solid state imaging device itself is not maintained at high accuracy. Further, although the CCD solid state imaging device (chip) itself is heated as described above, the heating temperature is not sufficiently high. In addition, a heat generating source exists at a local part on the surface of the chip so that a temperature distribution is not uniform. Thus, the proposed method is not effective in repairing the lattice defect, which causes the so-called fixed pattern noise, occurred at the portion near the photo-sensing section.

OBJECTS AND SUMMARY OF THE INVENTION

In view of the aforesaid shortcomings and disadvantages of the prior art, it is an object of the present invention to provide a solid state imager in which a lattice defect that is caused by a metal ion or the like entered thereto or by the radiation of radiant rays in accordance with an aging change can be repaired without disassembling the solid state imager.

It is another object of the present invention to provide a solid state imager in which the occurrence of a fixed pattern noise on a reproduced picture can be reduced readily.

According to a first aspect of the present invention, there is provided a solid state imaging device which comprises an image sensor for sensing an incident light, the image sensor having an image area on its surface, and a heating device for heating the image sensor from the opposite side to the surface, the heating device insulated from the image sensor by an insulating body.

According to a second aspect of the present invention, there is provided a solid state imaging device which comprises an image sensor for sensing an incident light, the image sensor having an image area on its surface, and a heating device comprising a heating element formed on the opposite side to the surface, a power source for supplying a voltage to the heating element and a switch for switching a supply of the voltage, the heating device heating the image sensor from the opposite side to the surface to thereby repair a lattice defect in the image sensor, the heating device insulated from the semiconductor substrate by an insulating body.

In accordance with a third aspect of the present invention, there is provided a solid state imaging device which comprises an image sensor for sensing an incident light, the image sensor having an image area on its surface, and a heating device comprising a heating element formed on the opposite side to the surface, a power source for supplying a voltage to the heating element and a switch for switching a supply of the voltage, the heating device heating the image sensor from the opposite side to the surface to thereby repair a lattice defect in the image sensor, the heating device insulated from the semiconductor substrate by an insulating body, and both the image sensor and the heating element being packaged in a package device.

The above and other objects, features, and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

The present invention will now be described with reference to FIGS. 1 to 4.

Figure 1:
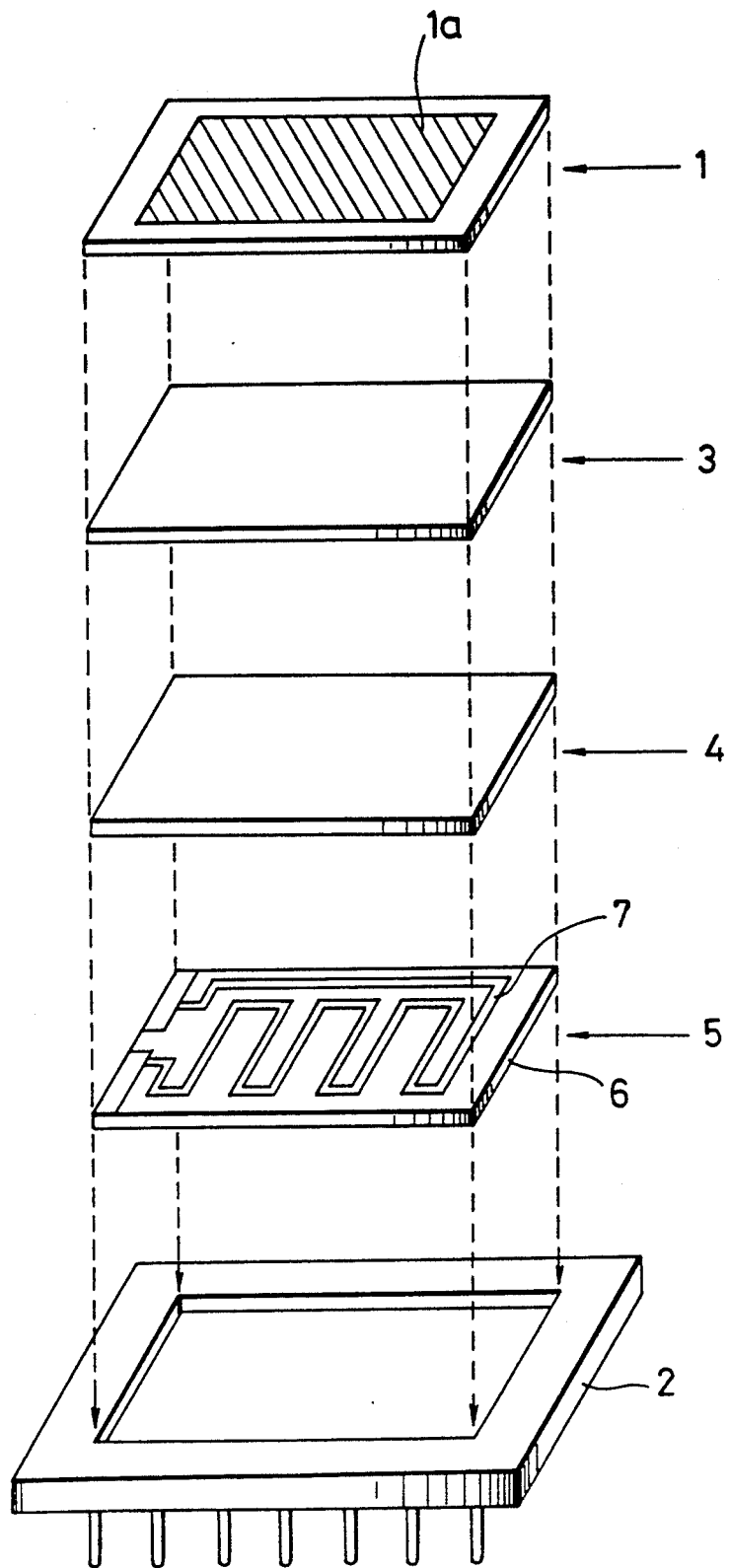
FIG. 1 is an exploded perspective view showing a structure of a CCD image sensor according to an embodiment of the present invention.

FIG. 1 is an exploded perspective view showing a solid state imaging device according to an embodiment of the present invention, e.g., a CCD image sensor.

As shown in FIG. 1, the CCD image sensor includes a CCD solid state imaging device (chip) 1 and a package 2. The CCD solid state image sensing device 1 includes an image section 1a where photo-sensing portions (pixels), each being formed of a pn-photodiode, are arrayed and formed on the surface of a silicon substrate serving as a base thereof in a matrix fashion. Further, CCD shift registers (vertical register and horizontal register) from which signal electric charges of each photo-sensing section are transferred to the output side are formed on the same substrate. A color filter and a micro-lens are formed on the image section 1a.

On the rear surface of the silicon substrate, there is formed a getter layer (polycrystalline silicon layer) which absorbs a metal ion entered from a metal exposed portion of a treatment apparatus or the like and a lattice defect caused by the entered metal ion during the CCD process, for example. The CCD solid state imaging device 1 has a substrate electrode 3 of a plate-like configuration disposed on its lower surface.

According to this embodiment, a heating device 5 is disposed on the lower surface of the substrate electrode 3 through an insulating material 4 of a plate-like configuration. The insulating material 4 is used to insulate the substrate electrode 3 and the heating device 5 from each other. Therefore, in the case of this embodiment, the CCD solid state imaging device 1, the substrate electrode 3, the insulating material 4 and the heating device 5 are packaged in the package 2 under the condition that they are collected as a set; thus, the CCD image sensor is constructed.

Figure 2:
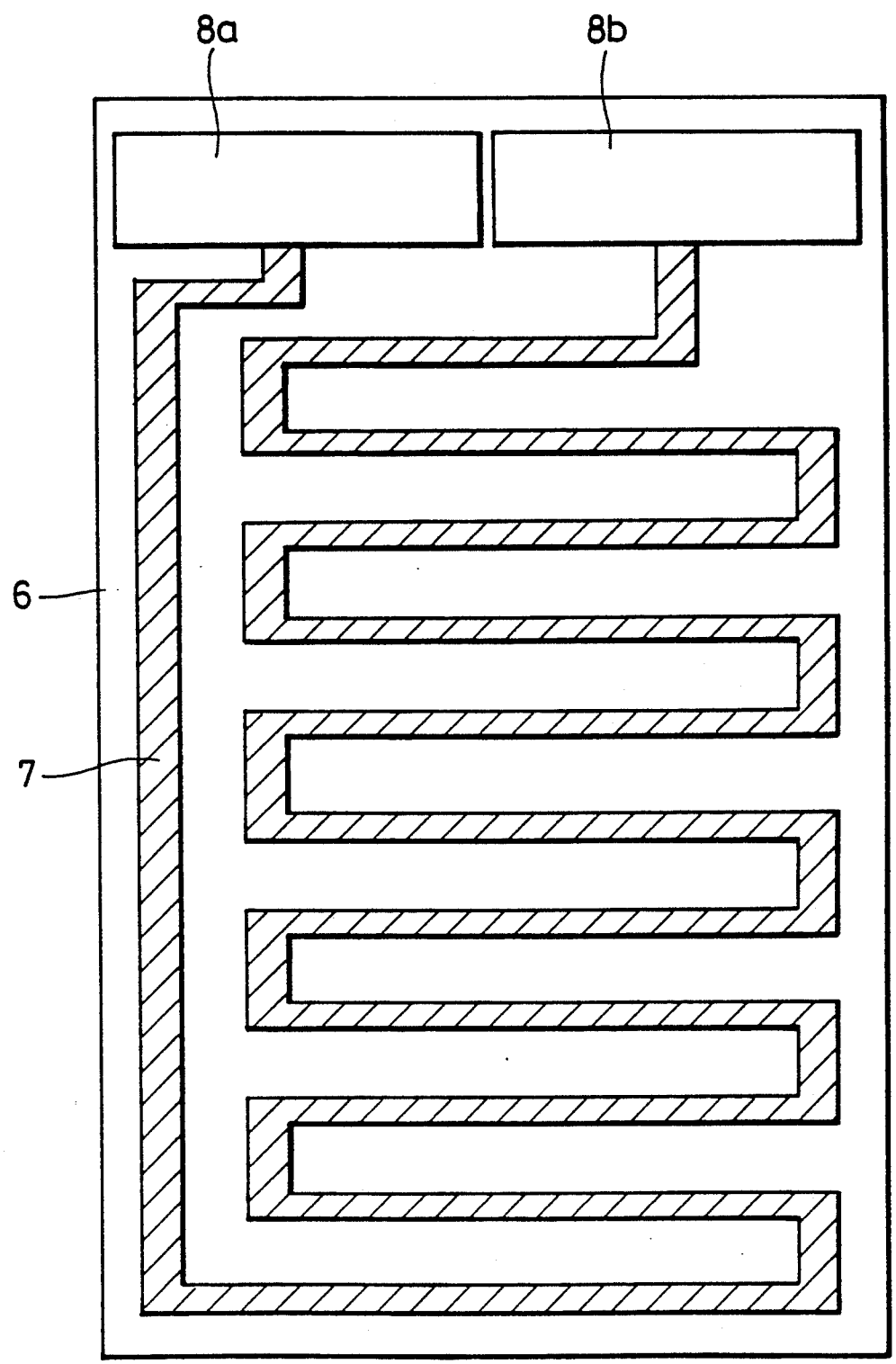
FIG. 2 is a plan view showing a heating device according to the present invention.

As shown in FIG. 1, the heating device 5 is formed of a resistance pattern 7 formed on the upper surface of a plate-shaped insulating body 6. According to this embodiment, as shown in FIG. 2, the resistance pattern 7 is formed on the upper surface of the insulating body 6 to construct the heating device 5 by a well-known thick film forming technique. Al (aluminum) pads 8a, 8b for deriving a power source are formed on both ends of the resistance pattern 7.

Figure 3:
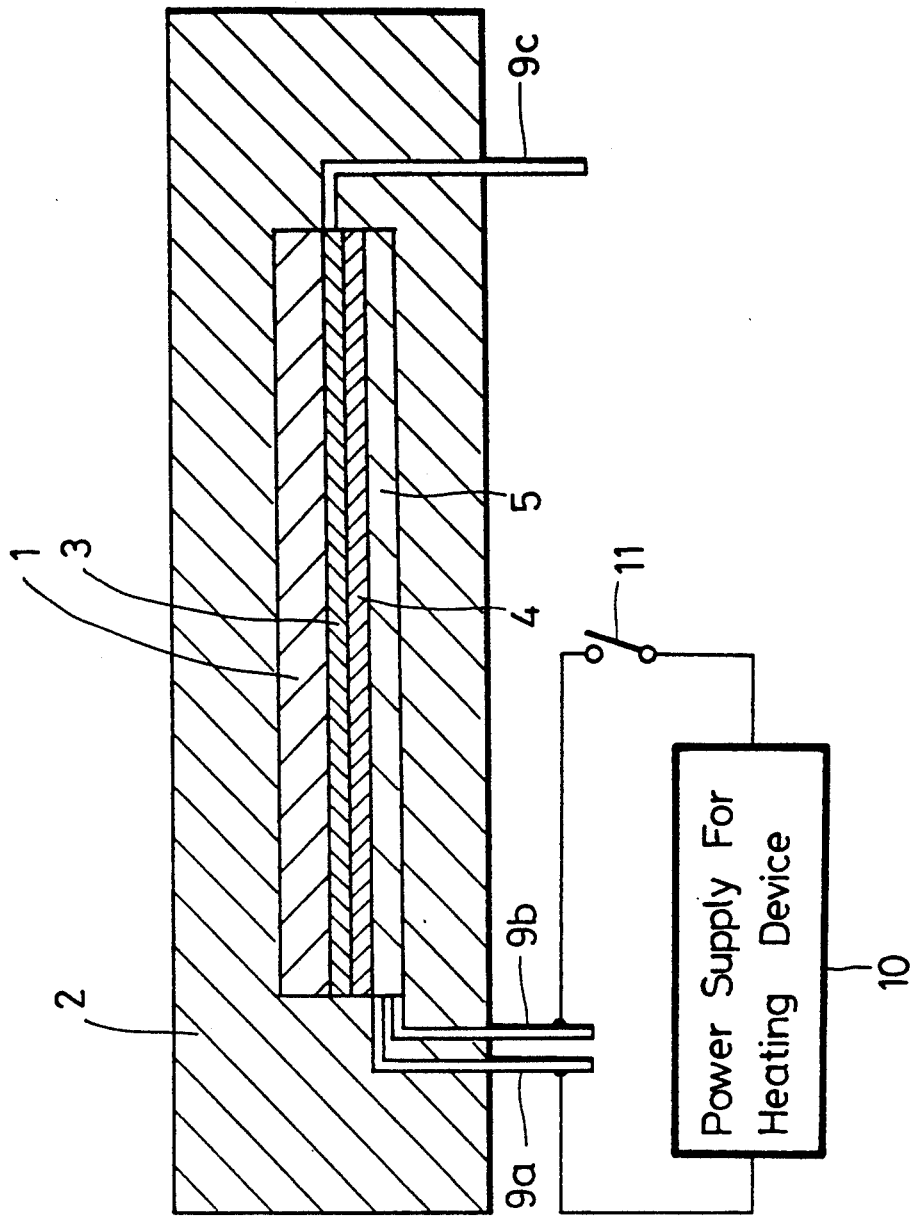
FIG. 3 is an explanatory diagram showing the condition that the CCD image sensor according to this embodiment is in use.

When the heating device 5 is packaged within the package 2 together with the CCD solid state imaging device, as shown in FIG. 3, external pins 9a, 9b that are not in use in external pins of the package 2 are electrically connected to the Al pads 8a, 8b of the heating device 5. In FIG. 3, reference numeral 9c depicts an external pin for the substrate electrode 3.

As shown in FIG. 3, the two external pins 9a, 9b that are electrically connected to the respective Al pads 8a, 8b are connected to two-polarity sides (positive polarity side and negative polarity side) of a power supply source 10 for the heating device 5. In particular, a switch 11 is connected between one external pin 9b and the power supply source 10.

When a fixed pattern noise that is displayed on the reproduced picture of a CCD image sensor in accordance with the aging change is reduced, the switch 11 is turned on to apply a voltage of several 10s of volts to the heating device 5 from the heating device power supply source 10 in the form of DC, AC or pulse such that a consumed electric power becomes several watts. Thus, the heating device 5 is conducted with a current of several 100s of milliamperes. By this conduction, the resistance pattern 7 on the insulating body 6 is energized to heat the CCD solid state imaging device 1 from the rear side thereof.

At that time, the heating temperature is selected to be sufficient so that the device characteristic of the CCD solid state imaging device 1 may not be deteriorated. For example, when the CCD solid state imaging device 1 has the micro-lens formed on the image section 1a thereof, the above heating temperature is set to be about 100° C. When the micro-lens is not formed on the image section 1a of the CCD solid state imaging device 1, the heating temperature is set to be about 400° C. It is desired that there is provided a temperature sensor or the like for maintaining this heating temperature during a constant period of time to feed a signal from this temperature sensor back to the heating device power supply source 10 to control the voltage and the current.

When the heating device 5 is driven during several 10s of minutes to several 100s of hours, the lattice defect caused by the metal ion, which leads to the fixed pattern noise, can be repaired. Therefore, the fixed pattern noise can be reduced effectively. Since the optimum values of the heating temperature and the heating time depend on the state of the CCD solid state imaging device 1 and the fixed pattern noise, it is desired that the voltage (current) level of the heating device power supply source 10 and the conducting time of the heating device 5 are determined appropriately each time the lattice defect is repaired.

Figure 4:
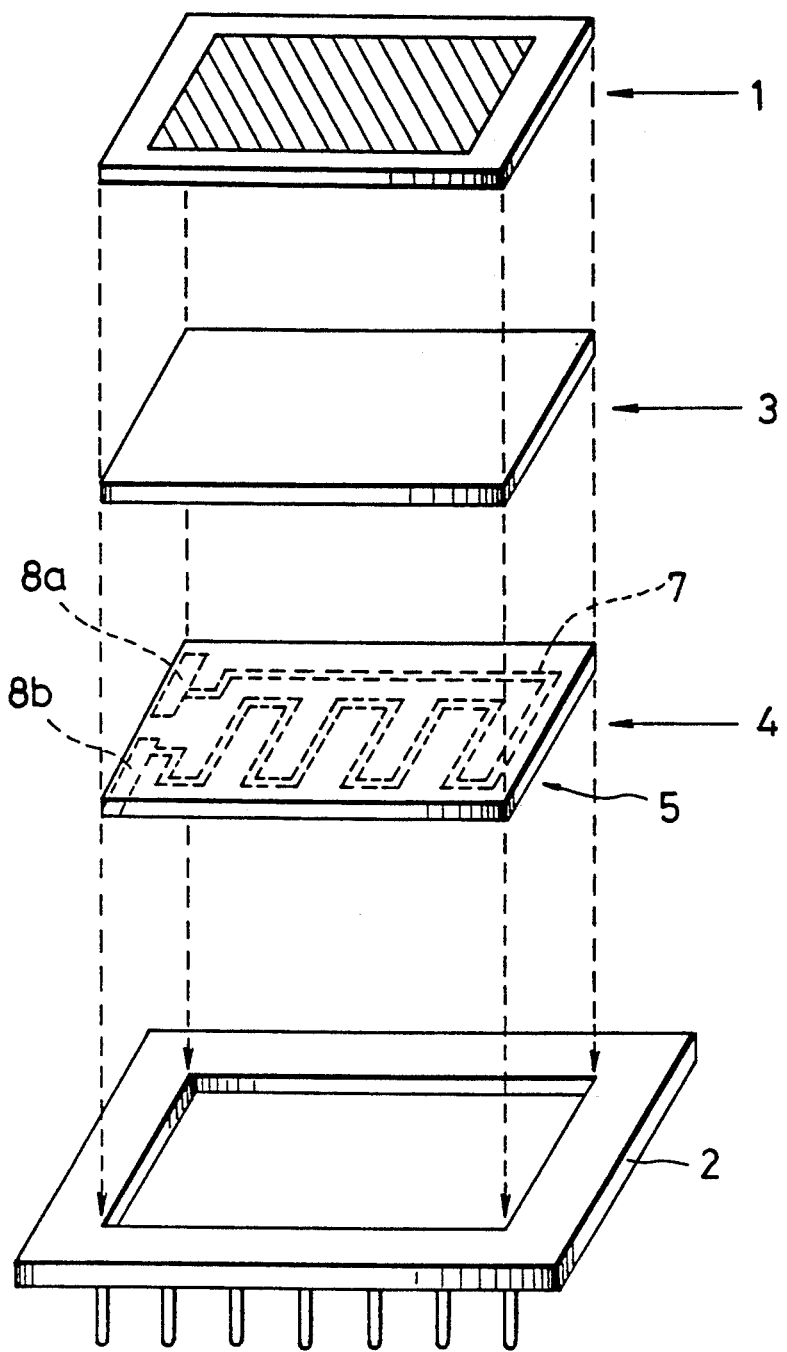
FIG. 4 is an exploded perspective view showing a structure of a CCD image sensor according to another embodiment of the present invention.

While the resistance pattern 7 and the Al pads 8a, 8b are formed on the upper surface of the insulating body 6 to construct the heating device 5 as described above, the present invention is not limited thereto and such a variant is also possible. That is, as shown in FIG. 4, the resistance pattern 7 and the Al pads 8a, 8b may be formed on the lower surface of the insulating material 4 to construct the heating device 5. In this case, the number of assembly parts is reduced as compared with that in the first embodiment shown in FIG. 1, which becomes advantageous in miniaturizing the solid state imager.

As described above, according to the embodiments of the present invention, the CCD solid state imaging device 1 can be exposed for a long period of time under a heating temperature set to be sufficient by the heating device 5 packaged within the package 2 so that the device characteristic of the CCD solid state imaging device 1 is not be deteriorated. Thus, even when the metal ion that is flowed from the micro-lens, the color filter or the like with a lapse of time enters the CCD solid state imaging device 1, the metal ion is easily moved by the above heating temperature so that the metal ion and the lattice defect caused thereby can be absorbed by the getter layer formed on the rear surface of the silicon substrate serving as the base of the CCD solid state imaging device 1.

Therefore, according to the CCD image sensor of the embodiments of the present invention, the lattice defect that is caused by the metal ion entered thereto or the like, for example, with the aging change, can be repaired without disassembling the CCD image sensor. Thus, the occurrence of the fixed pattern noise on the reproduced picture can be reduced.

In particular, if the heating device 5 is formed of the resistance pattern 7 formed on the upper surface of the insulating body 6 and the insulating body 6 is disposed on the lower surface of the CCD solid state imaging device 1 through the insulating material 4 as shown in FIG. 1 or if the heating device 5 is formed of the resistance pattern 7 formed on the lower surface of the insulating material 4 provided beneath the CCD solid state imaging device 1 as shown in FIG. 4, then the CCD solid state imaging device 1 can be uniformly heated from the rear surface thereof and the temperature distribution thereof can be made uniform, which can enhance the reducing effect of the fixed pattern noise much more.

While the fixed pattern noise can be reduced by repairing the lattice defect caused by the metal ion entered the CCD solid state imaging device as described above, the present invention is not limited to the metal ion. According to the present invention, a lattice defect caused by radiant rays entered the CCD solid state imaging device also can be repaired.

While the heating device 5 is formed of the resistance pattern 7 formed on the upper surface of the insulating body 6 or the heating device 5 is formed of the resistance pattern 7 formed on the lower surface of the insulating material 4 as described above, the present invention is not limited thereto and a standard resistance wire (e.g., nichrome wire) may be utilized. In this case, the above resistance wire may De wound around the insulating body 6 shown in FIG. 1.

According to the CCD solid state imaging device of the present invention, the lattice defect that is caused by the metal ion or the like entered into the CCD solid state imaging device in accordance with the aging change can be repaired without disassembling the solid state image sensor and the occurrence of fixed pattern noise on the reproduced picture can be reduced.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid state imaging device comprising:
image sensor means for sensing an incident light, said image sensor means having an image area on its surface; and
heating means comprising a heating element formed on an opposite side to said surface, power source means for supplying a voltage to said heating element and switching means for switching a supply of said voltage, said heating means heating said image sensor means from the opposite side to said surface to thereby repair a lattice defect in said image sensor means, said heating means being insulated from said semiconductor substrate by an electrical insulator.

2. The solid state imaging device according to claim 1, wherein said image sensor means comprises a semiconductor substrate which includes getter means for gettering.

3. The solid state imaging device according to claim 1, wherein said heating element comprises a resistance.

4. The solid state imaging device according to claim 1, wherein both said image sensor means and said heating element are packaged in a common package.

5. A solid state imaging apparatus comprising:
an image sensor having a semiconductor body for sensing an incident light; and
a heater for heating said image sensor thereby to repair a lattice defect in said image sensor.

6. A solid state imaging apparatus according to claim 5, further comprising switch means for causing said heater to heat said image sensor.

7. A solid state imaging apparatus according to claim 5, wherein said semiconductor body includes getter means for gettering.

8. A solid state imaging apparatus according to claim 5, wherein said heater comprises a resistance.

9. A solid state imaging apparatus comprising:

an image sensor having a semiconductor body for sensing an incident light; and a heater for heating said image sensor thereby to repair a lattice defect in said image sensor;

wherein both said image sensor and said heater are packaged in a common package.

10. A solid state imaging apparatus according to claim 9 further comprising switch means for causing said heater to heat said image sooner.

11. A solid state imaging apparatus according to claim 9 wherein said semiconductor body includes getter means for gettering.

12. A solid state imaging apparatus according to claim 9 wherein said heater comprises a resistance pattern.

* * * * *